(12) United States Patent
Itaya

(10) Patent No.: US 6,470,583 B2
(45) Date of Patent: Oct. 29, 2002

(54) EXAMINATION OF INSULATION DISPLACEMENT CONNECTION

(75) Inventor: Nobuyuki Itaya, Nagoya (JP)

(73) Assignees: Autonetworks Technologies, Ltd., Nagoya (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/953,857

(22) Filed: Sep. 18, 2001

(65) Prior Publication Data

US 2002/0029487 A1 Mar. 14, 2002

Related U.S. Application Data

(62) Division of application No. 09/387,855, filed on Sep. 1, 1999.

(30) Foreign Application Priority Data

Jan. 21, 1999 (JP) .......................................... 11-013304

(51) Int. Cl.⁷ .............................................. G01B 21/22
(52) U.S. Cl. ..................................... 33/501.02; 33/645
(58) Field of Search .......................... 33/228, 286, 613, 33/645, 701, DIG. 7, DIG. 21, 501.02, 501.03, 551; 73/159; 356/4.01, 601, 616, 622

(56) References Cited

U.S. PATENT DOCUMENTS

| | | | |
|---|---|---|---|
| 3,184,856 A | 5/1965 | Theuerkauf et al. ........... | 33/701 |
| 3,350,787 A | 11/1967 | Romano ....................... | 33/613 |
| 4,419,817 A | 12/1983 | Funcik et al. ................. | 29/749 |
| 4,586,264 A | 5/1986 | Zatezalo ....................... | 33/645 |
| 5,150,314 A * | 9/1992 | Garratt et al. ................. | 33/551 |
| 5,233,761 A | 8/1993 | Guraldi et al. ................. | 33/286 |
| 5,465,498 A | 11/1995 | Lycan ........................... | 33/645 |
| 5,491,903 A | 2/1996 | Osborn et al. ........... | 33/DIG. 7 |
| 5,588,216 A * | 12/1996 | Rank et al. .................... | 33/286 |
| 5,621,218 A * | 4/1997 | Tanaka ........................ | 356/622 |
| 6,195,615 B1 | 2/2001 | Lysen ........................... | 33/286 |
| 6,308,430 B1 * | 10/2001 | Itaya ............................ | 33/701 |

* cited by examiner

Primary Examiner—G. Bradley Bennett
(74) Attorney, Agent, or Firm—Oliff & Berridge, PLC

(57) ABSTRACT

A CCD laser displacement gauge is movable in three directions, that is, a vertical direction and two directions perpendicular to each other in a horizontal plane, and this gauge can be moved to a insulation displacement connecting center so as to detect a insulation displacement connecting height, the presence/absence of a wire, abnormal insulation displacement connection and a wire projecting amount. The insulation displacement connecting height, the wire presence/absence and the abnormal insulation displacement connection are detected by measuring a height of an upper surface of a wire sheath from a reference position at the position of the slot (at a middle position between two terminals if these terminals are juxtaposed). Whether or not the wire projecting amount is proper is determined by detecting the presence/absence of the wire at a position obtained by subtracting an absolute value of a tolerance from a normal projecting position. In the measurement, a waveform of a laser beam is sampled, and its peak is used as a measurement result. The CCD system detects the amount of light for each picture element, and even if there are variations in the surface condition of the wire which has just been insulation-displacement-connected, the position where the light amount is at a peak can be accurately detected.

1 Claim, 8 Drawing Sheets

EXAMINATION OF INSULATION DISPLACEMENT CONNECTION

This is a Division of application Ser. No. 09/387,855 filed Sep. 1, 1999. The entire disclosure of the prior application(s) is hereby incorporated by reference herein in its entirety.

BACKGROUND OF THE INVENTION

1. Field of the Invention

This invention relates to a method of examining insulation displacement connection, for example, in the production of a wire harness, and also relates to an apparatus for performing this method.

2. Description of the Related Art

As shown in FIGS. 7 and 8, a wire harness, for example, comprises parallel wires 50 each having a conductor 51 coated with an insulating resin 52, connectors 30 connected to the wires 50 at suitable regions in a lengthwise direction and a widthwise direction, and covers 31 attached to the respective connectors 30 if necessary. In view of the efficiency of the operation, insulation displacement fitting connector (hereinafter referred to as "insulation displacement connection") as shown in FIG. 8 has now been increasingly used for connecting the wires 50 to the connector 30.

As shown in FIG. 8, in this insulation displacement connection, a vertically-movable, insulation displacement connecting blade holder (not shown), having insulation displacement connecting blades 10 corresponding respectively to the wires 50, is moved downward, and a distal end surface of each of the insulation displacement connecting blades 10 press-fits the associated wire 50 into slots 41 a of an associated insulation displacement connecting terminal 40 of the connector 30, so that the wire is held in the terminal 40 by pinching, produced in the terminal 40 at this time, and hence is connected to the terminal. During this press-fitting operation, the insulating sheath 52 is cut by inner edges of the slots 41a, so that the conductor 51 in the insulating sheath 52 is brought into contact with the inner edges of the slots 41a, thereby making an electrical connection between the conductor 51 and the insulation displacement connecting terminal 40.

Examples of defective insulation displacement connection, developing during the above insulation displacement connecting operation, are as follows.

For some reason, if any of the wires, fed to the insulation displacement connecting step, is inserted in a twisted condition into the slots to be insulation-displacement-connected to the terminal, the wire can be press-fitted excessively or inadequately. Also, there is a possibility that the wire fails to be inserted into the slots, and the empty hitting occurs, so that a wire-absent condition develops. Alternatively, there can be encountered abnormal insulation displacement connection in which the wire to be inserted into the adjoining cavity is inserted, together with the proper wire, into one slot, so that the double wire-hitting occurs.

In the conventional insulation displacement connection examination, it is judged that the insulation displacement connection is finished when the insulation displacement connecting blade for press-fitting the wire into the slots, reaches its lower dead point. With this method, however, the above deficiencies can not be detected.

For example, in the case of "wire absence", the insulation displacement connecting blade reaches the lower dead point without undergoing any resistance, and even in the case of the abnormal insulation displacement connection (double wire-hitting), the insulation displacement connecting condition is not different from the proper insulation displacement connecting condition for one wire if the wires are soft, and if the force for pressing the insulation displacement connecting blade is extremely large.

SUMMARY OF THE INVENTION

It is therefore an object of this invention to provide a method of examining defective insulation displacement connection developing during the insulation displacement connecting operation, and also to provide an apparatus for performing this method.

In the present invention, in order to solve the above problems, by measuring a height of an upper surface of the insulation displacement connected wire from a reference position, the examination of the insulation displacement connection is effected. With this method, the presence of the wire can be directly detected, and therefore information of the insulation displacement connecting height, the wire presence/absence, the abnormal insulation displacement connection and the wire projecting amount, which represent the insulation displacement connected condition, can be obtained.

"The insulation displacement connecting height" is the height of the upper surface of the wire sheath from the reference position at the position of the slot. The reference position in the direction of the height may be any arbitrary position in the space, and can be, for example, an upper surface of a connector-positioning pallet (the bottom surface of the connector).

In the case where the connector (not shown) is of such a design that two terminals 41 are juxtaposed and spaced a distance $D_1$ from each other in the direction of the length of the wire 50 so that the wire can be insulation-displacement-connected at two portions thereof as shown in FIG. 5, the measurement position in the horizontal direction is a middle position Al between the two terminals 41 and 41. In the case where only one terminal 41 is attached to the wire 50 in the direction of the length of the wire, the measurement position in the horizontal direction is a position $A_2$ at which this terminal 41 exists.

With respect to "the wire presence/absence", if the wire is present, it is necessarily detected in the measurement of the wire insulation displacement connecting height. If the wire is absent, it detected when the height of the wire sheath from the reference position, measured in this measurement, represents a value smaller than its normal value by an amount equal to the normal outer diameter of the wire.

"The abnormal insulation displacement connection" is encountered, for example, if a plurality of wires are insulation-displacement-connected in a bundled manner into one slot, and in this case, the position of the sheath of the uppermost wire is measured, and therefore the measured value of the above insulation displacement connecting height is extraordinarily large, and therefore it is judged that this is the abnormal insulation displacement connection.

Although "the wire projecting amount" is the amount of projecting of the wire from the side surface of the terminal, this amount itself is not measured, and as shown in FIG. 5, a position B, obtained by subtracting an absolute value a of a tolerance from a normal projecting position (that is, a position advanced a normal projecting amount $D_2$ from the side surface of the terminal 41 in the direction of projecting of the wire 50), is defined as an examination position, and at this position B, the presence/absence of the wire 50 is detected according to the same procedure as described above for the examination of "the wire presence/absence", and the judgment is made based on this. More specifically, if the presence of the wire 50 at the examination position B is confirmed, it is decided that the projecting amount is normal, and if it is judged that the wire 50 is absent, it is decided that the projecting amount is not normal.

If not less than two of the wire insulation displacement connecting height, the wire projecting amount, the wire presence/absence and the abnormal wire insulation displacement connection are measured, the defective insulation displacement connection can be detected multilaterally, and the product of a high quality can be obtained.

In order to effect the above examination, there is used the apparatus provided with the CCD laser displacement gauge movable in the direction of juxtaposition of the wires.

In this apparatus, the CCD laser displacement gauge is scanningly moved in the direction of juxtaposition of the wires so that the measurements in the above Items can be made.

The reasons why the laser displacement gauge is used are that it is not desirable to apply a load to the wire at the insulation displacement connecting position and that not a contact-type (which applies a load) but a non-contact-type measurement instrument need to be used. The reasons why the CCD system is used are that the amount of light for each picture element can be detected and that even if the light amount varies depending on the surface condition of the object to be measured, the position where the light amount is at a peak can be accurately detected. In the insulation displacement connecting position, the insulation displacement connected wire is pressed by the insulation displacement connecting blade, and also receives forces from the inner edges of the slot, so that the surface of the wire is not flat, and therefore the function of the CCD system is needed.

Although various colors and patterns are used for the sheath of the wires of the wire harness, the CCD laser system is not influenced by these elements.

The present disclosure relates to the subject matter contained in Japanese patent application No. Hei. 11-13304 (filed on Jan. 21, 1999) which is expressly incorporated herein by reference in its entirely.

DETAILED DESCRIPTION OF THE PREFERRED EMBODIMENTS

Figure 1:
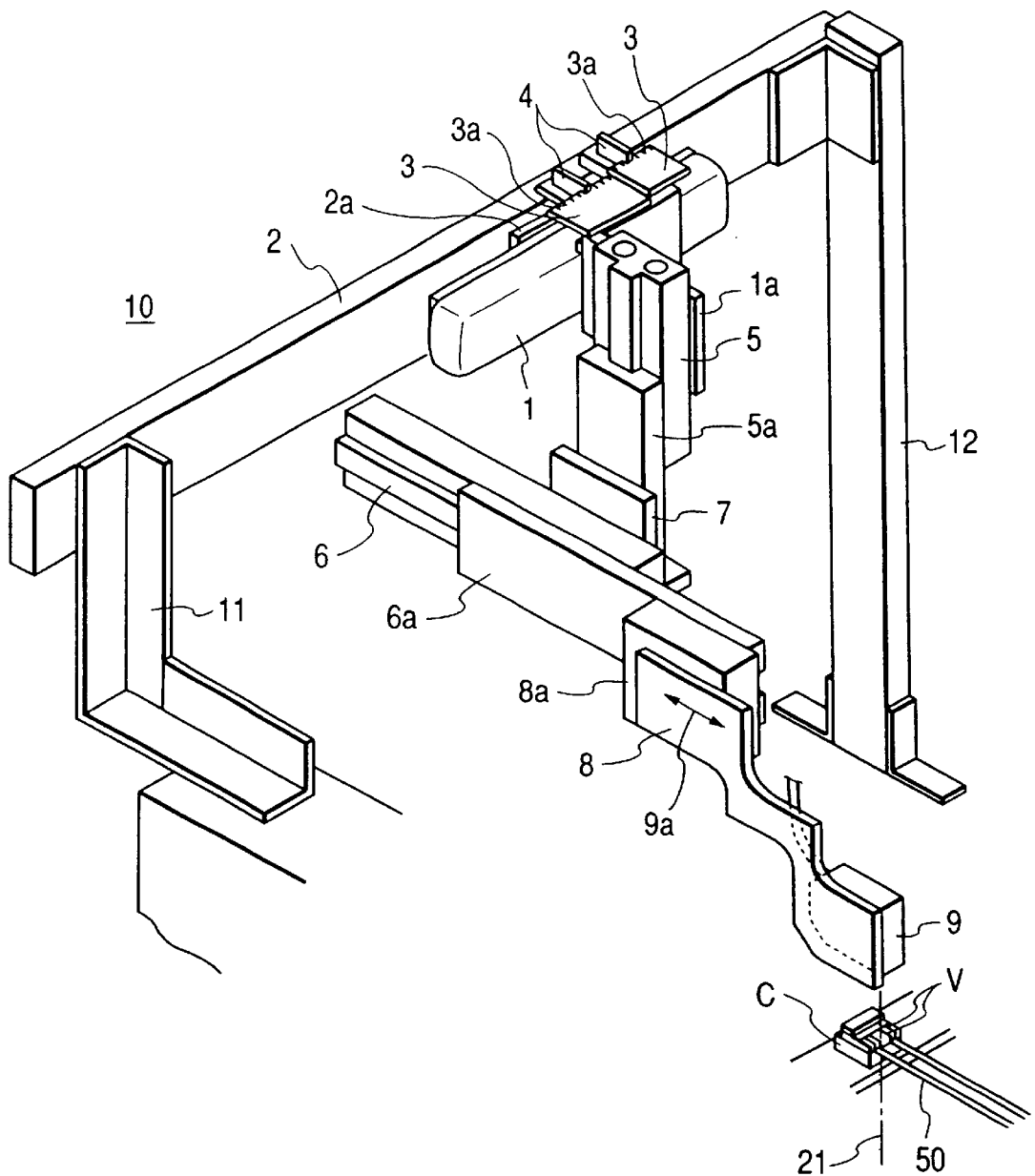
FIG. 1 a perspective view of a preferred embodiment of 3D a moving mechanism of the invention.
Figure 2:
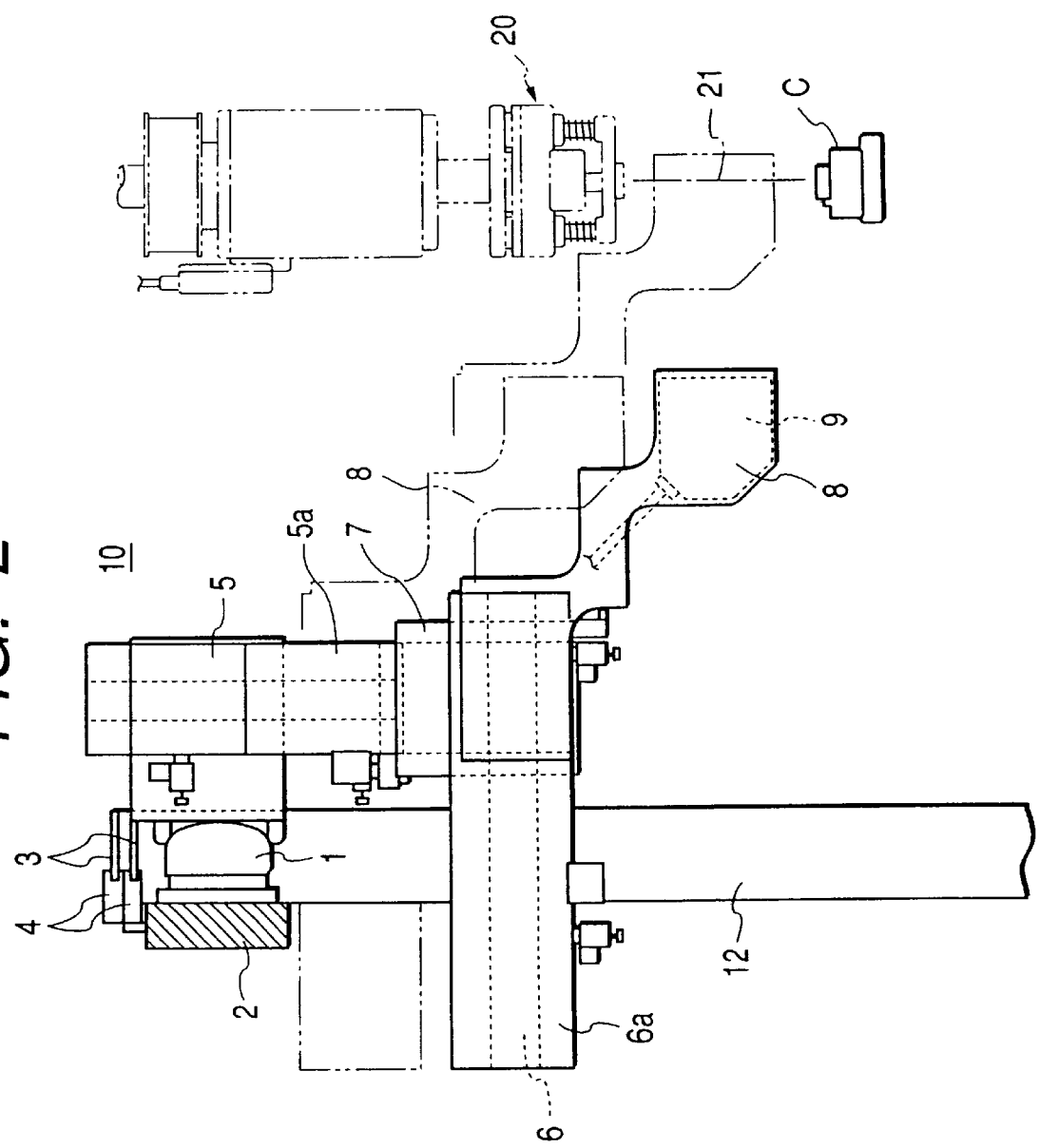
FIG. 2 is a side-elevational view of the embodiment.
Figure 3:
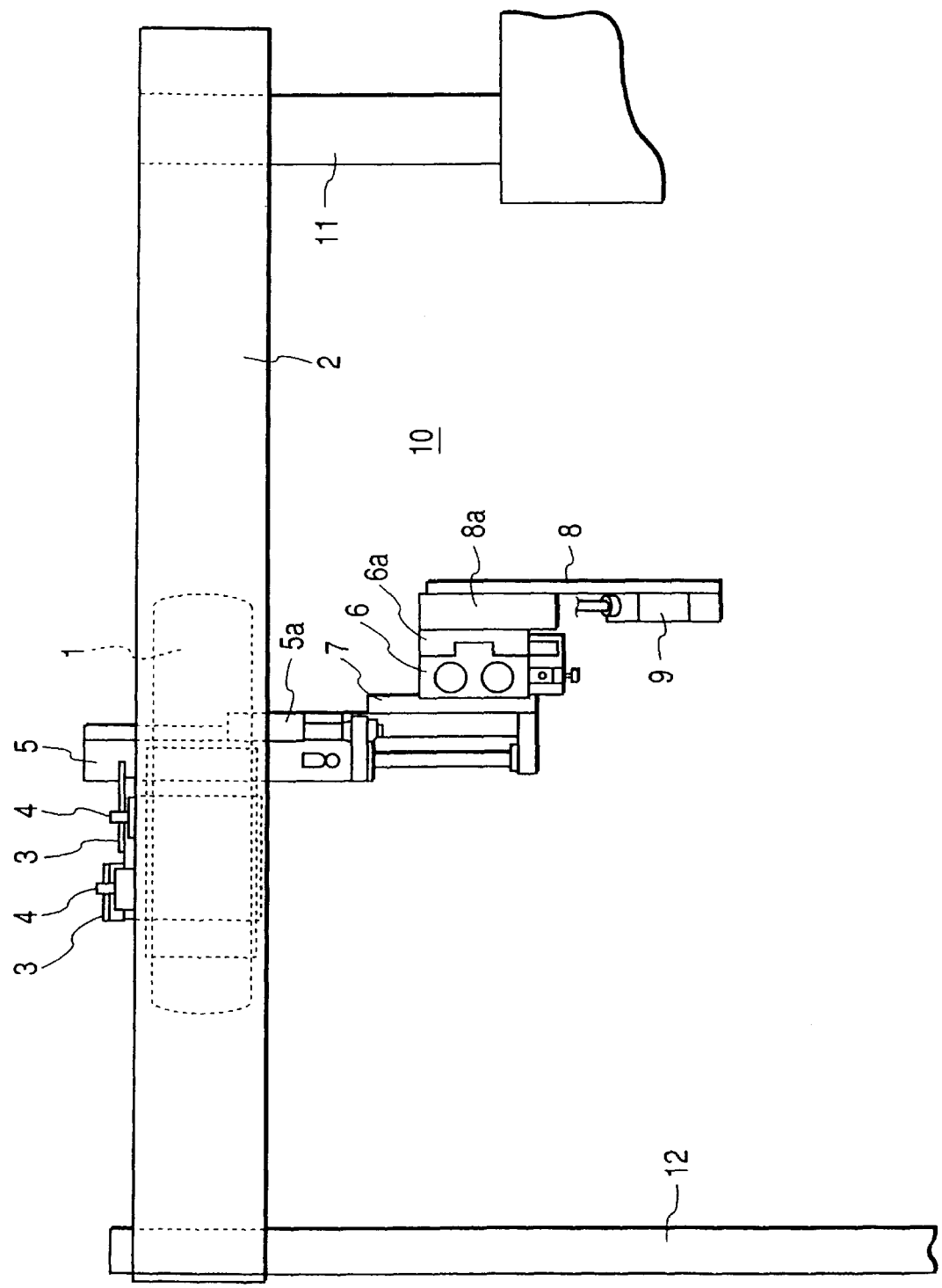
FIG. 3 is a rear view of the embodiment.
Figure 4:
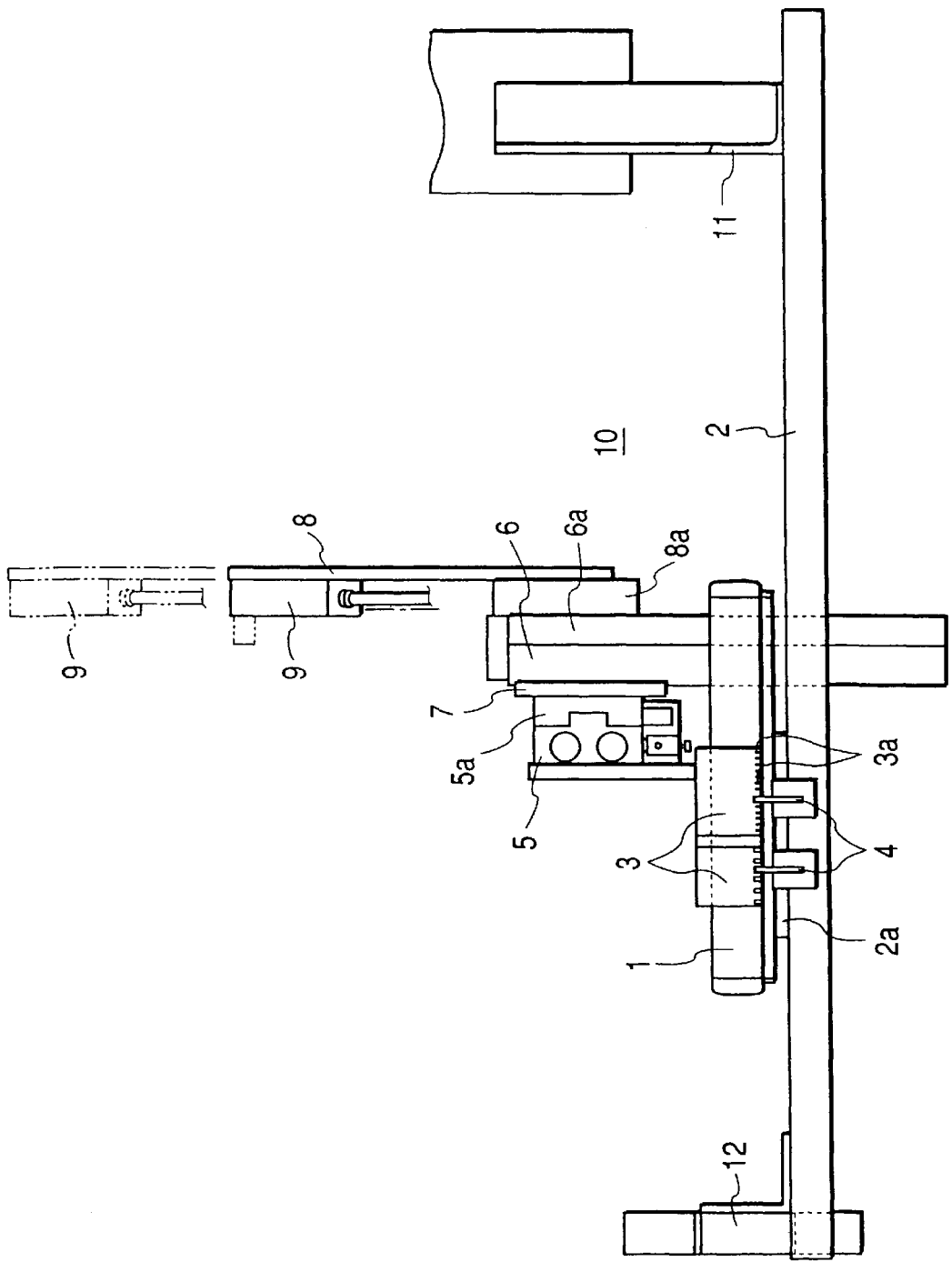
FIG. 4 is a plan view of the embodiment.

A preferred embodiment of the present invention will now be described with reference to the drawings. An examination apparatus of this embodiment is incorporated in an area of a insulation displacement connecting process, and a moving mechanism for moving a CCD laser displacement gauge for effecting measurements for examination purposes is provided in the vicinity of an insulation displacement connecting machine.

The moving-mechanism 10, shown in FIGS. 1 to 4, effects movements in three directions (that is, a vertical direction and two directions perpendicular to each other in a horizontal plane) so as to move the CCD laser displacement gauge 9 from a predetermined stand-by position to a measurement position (insulation displacement connecting center), and this moving mechanism 10 is supported on two vertically-extending, posts 11 and 12.

A guide plate 2 for a slider 1 for horizontally moving the CCD laser displacement gauge 9 extends horizontally between the two posts 11 and 12. A mounting plate 2a for mounting the slider 1 is formed on a longitudinal side surface of the plate 2, and the slider 1 is coupled to the mounting plate 2a, and is driven by a servo motor (not shown). The direction (horizontal direction) of movement of the slider 1 is parallel to a direction of juxtaposition of cavities V in a connector C, that is, a direction of juxtaposition of wires to be insulation-displacement-connected to respective terminals (i.e., a direction of the width of the connector C). Slit plates 3 are mounted on an upper surface of the slider 1, and photo-microsensors 4 for projecting light onto the slit plates 3 so as to detect the movement of the slider 1 are mounted on an upper surface of the guide plate 2.

An air cylinder 5 for vertically moving the CCD laser displacement gauge 9 is mounted on the slider 1 through a bracket 1a.

An air cylinder 6 for moving the CCD laser displacement gauge 9 in a horizontal direction perpendicular to the direction of horizontal movement of the slider 1 is mounted on a moving portion 5a of the air cylinder 5 through a bracket 7.

A bracket 8 for mounting the CCD laser displacement gauge 9 thereon is mounted on a moving portion 6a of the air cylinder 6 through a cylinder 8a, and the CCD laser displacement gauge 9 is mounted on one side of a lower end portion of this bracket 8. When the projecting amount is to be measured, the cylinder 8a moves the bracket 8 in a direction of arrow 9a (FIG. 1) so as to move the CCD laser displacement gauge 9 to the projecting amount examination position disposed forwardly of the insulation displacement connecting height examination position.

With the apparatus of the above construction, the CCD laser displacement gauge 9 can be moved in the three directions (that is, the vertical direction and the two directions perpendicular to each other in the horizontal plane) to approach from the predetermined stand-by position to the measurement position.

In this embodiment, the measurements in the following four Items are made by the use of the above apparatus, thereby effecting the insulation displacement connection examination.

(1) Insulation displacement connecting height
(2) Present/absence of the wire
(3) Abnormal insulation displacement connection
(4) Wire projecting amount The methods for measuring these are as described above. Although the reference position in the direction of the height maybe any arbitrary position in the space, this reference position in this embodiment is the upper surface of the connector C.

Figure 5:
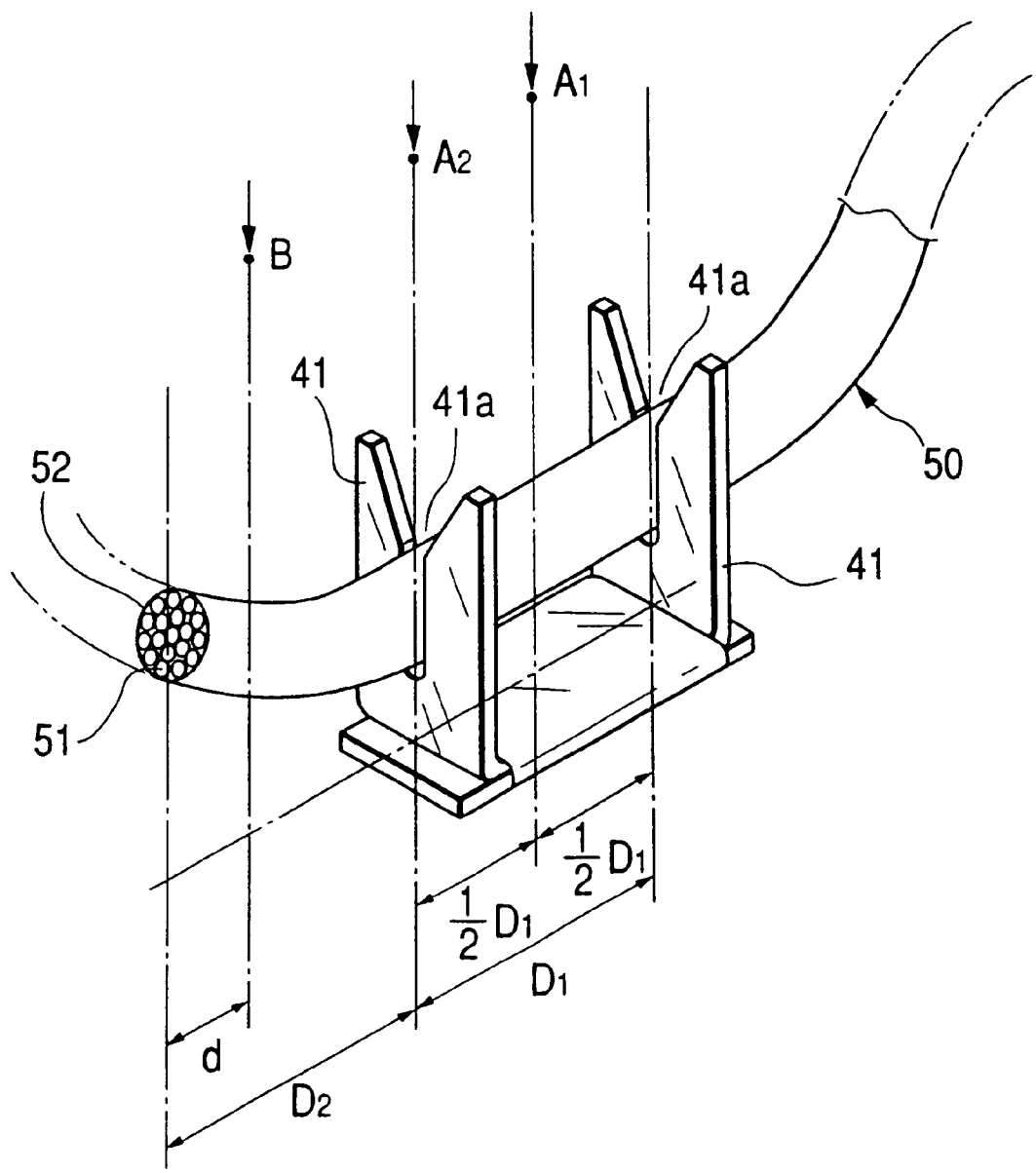
FIG. 5 is a perspective view showing a measurement position.

In the case where the connector (not shown) is of such a design that two terminals 41 are juxtaposed and spaced a distance $D_1$ from each other in the direction of the length of the wire 50 so that the wire can be insulation displacement connected at two portions thereof as shown in FIG. 5, the measurement position in the horizontal direction with respect to the, above Items (1) to (3) is a middle position $A_1$ between the two terminals 41 and 41. In the case where only one terminal 41 is attached to the wire 50 in the direction of the length of the wire, the measurement position in the horizontal direction is a position $A_2$ at which this terminal 41 exists.

As described above, in the measurement of "the wire projecting amount" of the above Item (4), at a position B, obtained by subtracting an absolute value d of a tolerance from a normal projecting position (that is, a position advanced a normal projecting amount $D_2$ from the side surface of the terminal 41 in the direction of projecting of the wire 50 as shown in FIG. 5), the presence/absence of the wire 50 is detected according to the same procedure as described above for the examination of "the wire presence/absence" of the above Item (2), and the judgment is made based on this. More specifically, if the presence of the wire 50 at the examination position B is confirmed, it is decided that the projecting amount is normal, and if it is judged that the wire 50 is absent, it is decided that-the projecting amount is not normal.

In this embodiment, the examination is conducted for each insulation displacement connecting operation, that is, for each connector C of the wire harness. Therefore, in the above-mentioned measurement position, the CCD laser displacement gauge 9 is scanningly moved in the direction of juxtaposition of the wires 50. The slider 1 effects this horizontal movement, and as described above, the slit plates 3 are fixedly mounted on the slider 1, and the photo-microsensors 4 are mounted on the upper surface of the guide plate 2 along which the slider 1 slides. The photo-microsensors 4 project light during the examination process, and when the slider 1 slides, the light is intercepted by the slit plates 3, mounted on the slider 1, and passes through slits $3a$ in these slit plates. These are used as timing signals, and the timing of measurement for each cavity V is determined. The timing of the examination is a time period from a leading edge of this signal to a leading edge of the next signal, and during this time period, the examination of the insulation displacement connection of the wire 50 in one cavity V is effected. Namely, the slits $3a$ in the slit plates 3 correspond to the cavities V, respectively.

In the measurement, a waveform of the laser beam is sampled during the measurement period, and its peak is used as a measurement result. The reasons why the CCD system is used are that the amount of light for each picture element can be detected and that even if there are variations in the surface condition of the wire 50 which has just been insulation-displacement-connected at the insulation displacement connecting position, and therefore is pressed by the insulation displacement connecting blade, and also receives forces from the inner edges of the slot $41a$, so that the wire 50 is deformed, the position where the light amount is at a peak can be accurately detected.

Figure 6:
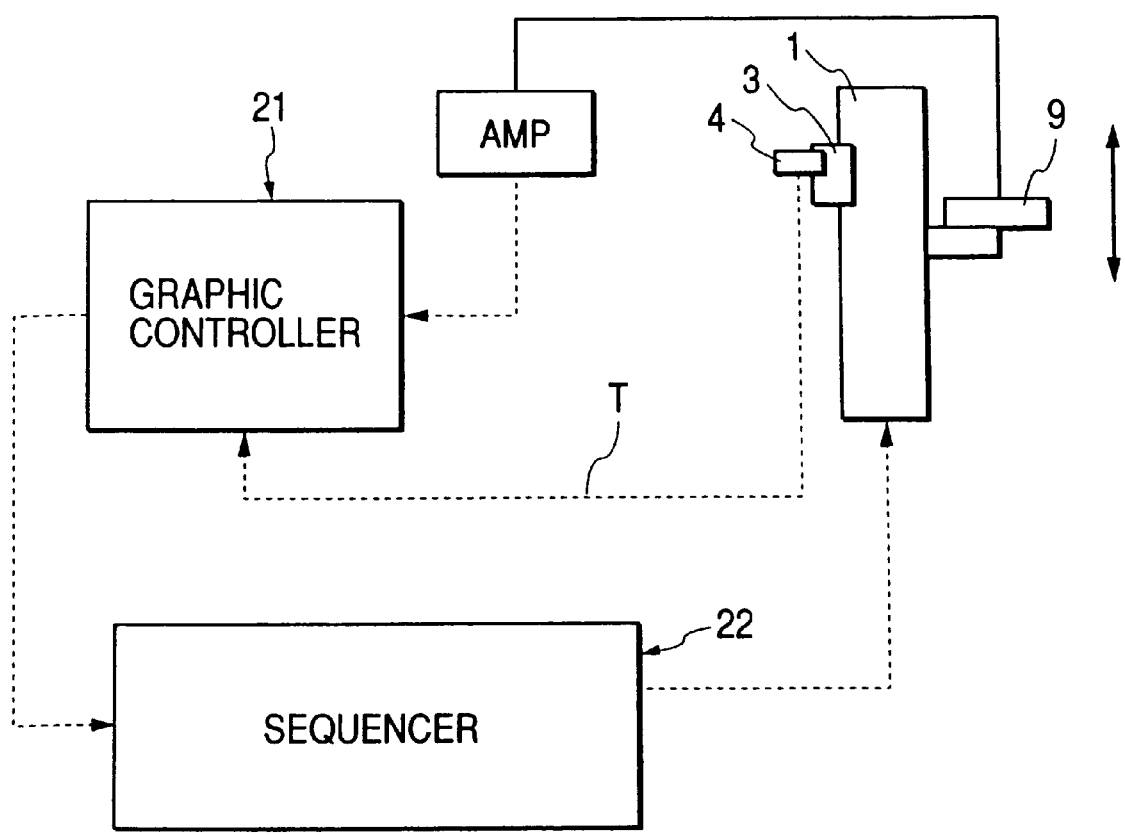
FIG. 6 is a diagram showing a control construction.
Figure 7:
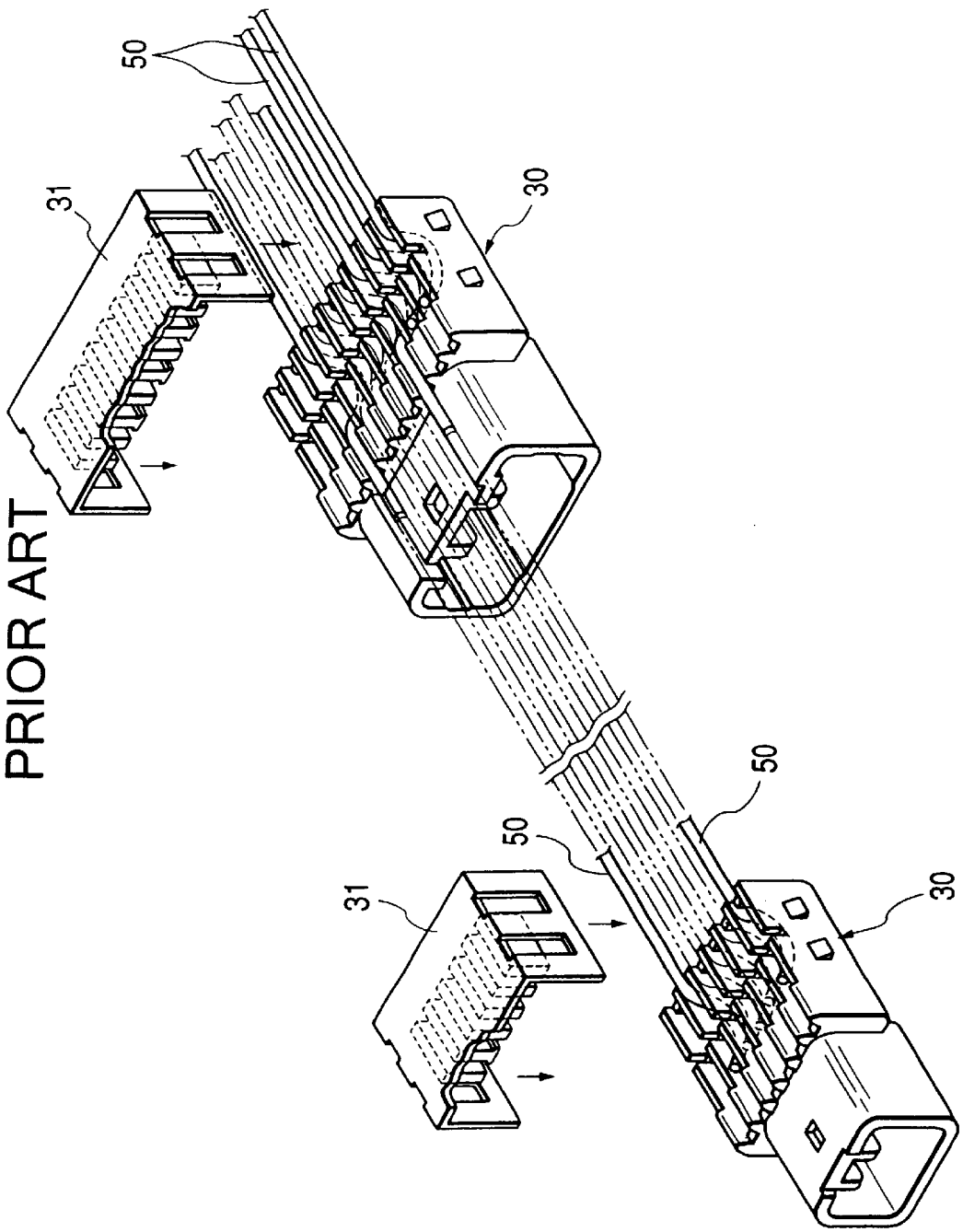
FIG. 7 is a perspective view showing an example of a wire harness.
Figure 8:
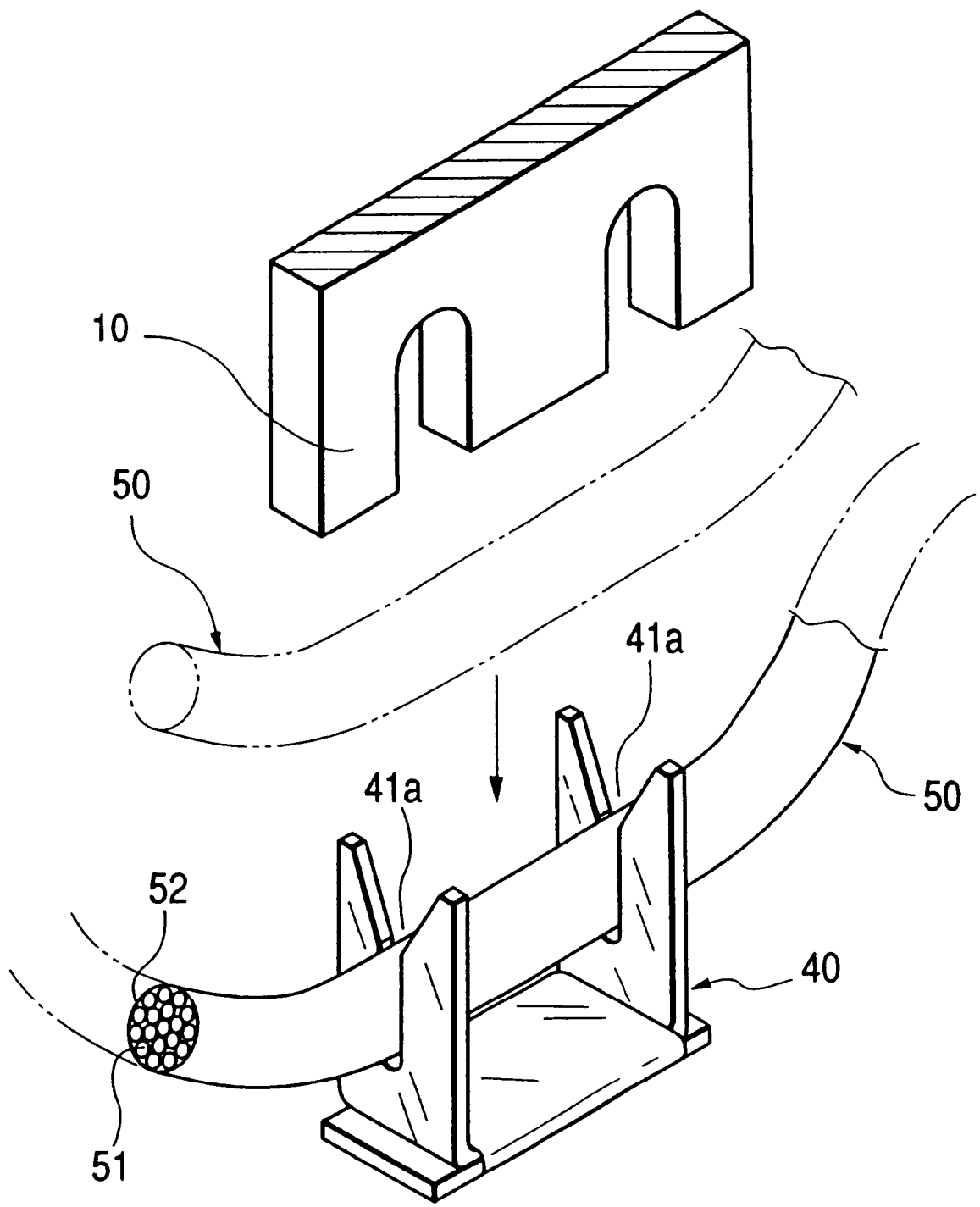
FIG. 8 is a perspective view showing insulation displacement connection.

As shown in FIG. 6, with respect to the construction of the control, the start and end of the measurement are transmitted to a sequencer 22 via a graphic controller 21 on the basis of the timing signal T produced by the combination of the photo-microsensors 4 and the slit plates 3, and a measurement instruction is fed from the sequencer 22 to the CCD laser displacement gauge 9.

The sequencer 22 instructs the slider 1 and the two cylinders 5 and 6 to move the CCD laser displacement gauge 9 to the insulation displacement connecting position, and further instructs the slider 1 to move the CCD laser displacement gauge 9, disposed at this insulation displacement connecting position, in the direction of juxtaposition of the wires 50 for scanning purposes, and further instructs the cylinder $8a$ (which serves to move the CCD laser displacement gauge 9 to the projecting amount examination position disposed forwardly of the insulation displacement connecting height examination position) to move the bracket 8, having the CCD laser displacement gauge 9 mounted thereon, in the direction of the arrow $9a$ when the projecting amount is to be measured.

When the number of cavities is changed depending on the type of the connector to be used, and when the number of the insulation displacement connections of the wires and the insulation displacement connecting positions are changed even if the number of the cavities are the same, data, related to the corresponding specification, are beforehand programmed in the sequencer 22 and the graphic controller 21, and the control is effected.

With respect to the measurement results, the measurement result within the tolerance is indicated as "Go", the measurement result larger than the upper limit of the tolerance is indicated as "H", and the measurement result smaller than the lower limit of the tolerance is indicated as "L".

With respect to those products, judged defective in the examination, the cover is attached to the connector C after the insulation displacement connecting process, thereby providing the finished product, and thereafter such defective products are separated from the good products, and are discarded.

As described above, in the present invention, by measuring the height of the upper surface of the sheath of the insulation displacement connected wire from the reference position, the examination of the insulation displacement connection is effected, and therefore the presence of the wire can be directly detected, and the examination can be carried out positively.

With this examination method, the examinations of "the insulation displacement connecting height", "the wire presence/absence", "the abnormal insulation displacement connection" and "the wire projecting amount" can be conducted.

"The insulation displacement connecting height" is the height of the upper surface of the wire sheath from the reference position at the position of the slot.

With respect to "the wire presence/absence", if the wire is present, it is necessarily detected in the measurement of the wire insulation displacement connecting height. If the wire is absent, it detected when the height of the wire sheath from the reference position, measured in this measurement, represents a value smaller than its normal value by an amount equal to the normal outer diameter of the wire.

When the measured value of the insulation displacement connecting height is extraordinarily large, this indicates "the abnormal insulation displacement connection"

Although "the wire projecting amount" is the amount of projecting of the wire from the side surface of the terminal, this amount itself is not measured, and the position, obtained by subtracting an absolute value of a tolerance from the normal projecting position (that is, the position advanced a normal projecting amount from the side surface of the terminal in the direction of projecting of the wire), is defined as an examination position, and at this position, the presence/absence of the wire is detected according to the same procedure as described for the examination of "the wire presence/absence". More specifically, if the presence of the wire at this-examination position is confirmed, it is decided that the projecting amount is normal, and if it is judged that the wire is absent, it is decided that the projecting amount is not normal.

If not less than two of the wire insulation displacement connecting height, the wire projecting amount, the wire presence/absence and the abnormal wire insulation displacement connection are measured, the defective insulation displacement connection can be detected multilaterally, and the product of a high quality can be obtained.

If the CCD laser displacement gauge is used for effecting the above examination, the measurement can be effected in non-contact relation to the wires to be measured, and therefore a force will not be applied to the insulation displacement connected portion of the wire, thus eliminating a possibility that this portion is damaged. And besides, since the high-speed sampling can be effected, the measurement can be carried out during the operation, and therefore the operation rate will not be much decreased.

What is claimed is:

1. An apparatus for conducting examining insulation displacement connection of a plurality of juxtaposed terminals comprising:

a CCD laser displacement gauge which is movable in a direction of juxtaposition of said terminals, two posts extending vertically, a guide plate for a slider for horizontally moving said CCD laser displacement gauge, which extends horizontally between said two posts, at least one guide groove for guiding said slider which is formed on a longitudinal side surface of said guide plate, and which is coupled to said at least one guide groove, at least a first slit plate and a second slit plate mounted on an upper surface of said slider having slits formed on a surface of each of the slit plates, wherein a displacement of the first slit plate with respect to the second slit plate corresponds to a movement of said slider, at least one photo-microsensor for projecting light onto said first slit plate and said second slit plate in order to detect the movement of said slider, the at least one photo-microsensor being mounted on an upper surface of said guide plate, two air cylinders for vertically and horizontally moving said CCD laser displacement gauge, one air cylinder is mounted on said slider through a bracket so as to move in a vertical direction and the other air cylinder is mounted on a moving portion of said one air cylinder through a bracket so as to move in a horizontal direction perpendicular to the direction of horizontal movement of said slider.

* * * * *